(12) United States Patent
Kogure et al.

(10) Patent No.: US 9,917,615 B2
(45) Date of Patent: Mar. 13, 2018

(54) RADIO-FREQUENCY MODULE

(71) Applicant: Murata Manufacturing Co., Ltd., Nagaokakyo-shi, Kyoto-fu (JP)

(72) Inventors: Takeshi Kogure, Nagaokakyo (JP); Atsushi Ono, Nagaokakyo (JP); Hiroyuki Nagamori, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/607,734

(22) Filed: May 30, 2017

(65) Prior Publication Data

US 2017/0264337 A1 Sep. 14, 2017

Related U.S. Application Data

(63) Continuation of application No. PCT/JP2015/082824, filed on Nov. 24, 2015.

(30) Foreign Application Priority Data

Dec. 25, 2014 (JP) ................................ 2014-261518

(51) Int. Cl.
*H04B 1/525* (2015.01)
*H04B 1/44* (2006.01)
(Continued)

(52) U.S. Cl.
CPC ............... *H04B 1/525* (2013.01); *G01S 1/20* (2013.01); *H03J 7/186* (2013.01); *H04B 1/04* (2013.01);
(Continued)

(58) Field of Classification Search
CPC .................................. H04B 1/525; H04B 1/04
See application file for complete search history.

(56) References Cited

U.S. PATENT DOCUMENTS 8,483,104 B1* 7/2013 Saji ..................... H04B 1/525
370/276
2010/0273535 A1* 10/2010 Inamori ................. H03F 3/211
455/571

(Continued)

FOREIGN PATENT DOCUMENTS

JP 2007-124202 A 5/2007
JP 2010-273321 A 12/2010
(Continued)

OTHER PUBLICATIONS

Official Communication issued in International Patent Application No. PCT/JP2015/082824, dated Feb. 16, 2016.

*Primary Examiner* — Tuan H Nguyen
(74) *Attorney, Agent, or Firm* — Keating & Bennett, LLP

(57) ABSTRACT

A radio-frequency module includes a first transmitter-and-receiver that transmits and receives a signal in a first band, and a second transmitter-and-receiver that transmits and receives a signal in a second band higher than the first band. The first transmitter-and-receiver includes a first amplifier circuit and a first separator circuit and the second transmitter-and-receiver includes a second amplifier circuit and a second separator circuit. The first separator is located on a substrate between the first amplifier circuit and the second separator circuit, such that the first separator circuit is spatially interposed between the first amplifier circuit and the second separator circuit.

19 Claims, 7 Drawing Sheets

(51) Int. Cl.
*H04B 1/04* (2006.01)
*H04B 1/12* (2006.01)
*G01S 1/20* (2006.01)
*H03J 7/18* (2006.01)

(52) U.S. Cl.
CPC ............... *H04B 1/123* (2013.01); *H04B 1/44* (2013.01); *H04B 2001/045* (2013.01)

(56) References Cited

U.S. PATENT DOCUMENTS

2014/0051367 A1   2/2014   Saji et al.
2016/0006415 A1   1/2016   Takematsu

FOREIGN PATENT DOCUMENTS

JP    2014-039167 A    2/2014
WO    2014/171033 A1   10/2014

* cited by examiner

RADIO-FREQUENCY MODULE

CROSS REFERENCE TO RELATED APPLICATIONS

This application claims the benefit of priority to Japanese Patent Application No. 2014-261518 filed on Dec. 25, 2014 and is a Continuation application of PCT Application No. PCT/JP2015/082824 filed on Nov. 24, 2015. The entire contents of each application are hereby incorporated herein by reference.

BACKGROUND OF THE INVENTION

1. Field of the Invention

The present invention relates to a radio-frequency module which wirelessly transmits and receives signals of different bands at the same time.

2. Description of the Related Art

As an example of recent communication methods for wirelessly transmitting and receiving signals of different bands at the same time, carrier aggregation is known. In a radio-frequency module supporting carrier aggregation, an antenna, a receive circuit, an amplifier circuit for amplifying a transmitting signal, and a separator are required for each band.

If the size of a radio-frequency module implementing carrier aggregation is reduced, isolation characteristics of each band are decreased. More specifically, if the size of a radio-frequency module is reduced, harmonic components of a transmitting signal amplified in a low-band amplifier circuit are more likely to leak into a high-band receive circuit.

Accordingly, in the radio-frequency module disclosed in Japanese Unexamined Patent Application Publication No. 2007-124202, a matching circuit included in a low-band amplifier circuit is not connected to a ground pattern within a substrate, but is connected to a ground terminal on the back surface of the substrate, so as to suppress a leakage of harmonic components of a transmitting signal into a high-band receive circuit via a ground pattern within the substrate.

However, the radio-frequency module disclosed in Japanese Unexamined Patent Application Publication No. 2007-124202 is effective in suppressing a leakage only via a ground pattern, and is not effective in suppressing a leakage via paths other than a ground pattern. This will be explained more specifically. In a radio-frequency module, electromagnetic coupling and electrostatic coupling (hereinafter simply referred to as "coupling") may occur between devices or between transmission lines. If the size of the radio-frequency module is reduced, coupling is more likely to occur between the devices or between the transmission lines, and, due to this coupling, a path is more likely to be formed. In the radio-frequency module disclosed in Japanese Unexamined Patent Application Publication No. 2007-124202, it is not possible to suppress a leakage via a path formed by this coupling.

SUMMARY OF THE INVENTION

Preferred embodiments of the present invention provide radio-frequency modules which wirelessly transmit and receive signals of different bands at the same time and which improve isolation characteristics of each band.

In a radio-frequency module according to a preferred embodiment of the present invention, a first transmitter-and-receiver that transmits and receives a signal in a first band (for example, a band including 900 MHz) and a second transmitter-and-receiver that transmits and receives a signal in a second band (a band including 1800 MHz) which is higher than the first band are mounted on a substrate.

More specifically, the first transmitter-and-receiver includes a first antenna terminal connected to a first antenna, a first receive terminal connected to a receive circuit, a first amplifier circuit that amplifies a transmitting signal, and a first separator circuit that causes a transmitting signal in the first band amplified by the first amplifier circuit to pass through the first separator circuit and transmits the transmitting signal to the first antenna terminal and that causes a received signal in the first band input from the first antenna terminal to pass through the first separator circuit and transmits the received signal to the first receive terminal. The second transmitter-and-receiver includes a second antenna terminal connected to a second antenna, a second receive terminal connected to a receive circuit, a second amplifier circuit that amplifies a transmitting signal, and a second separator circuit that causes a transmitting signal in the second band amplified by the second amplifier circuit to pass through the second separator circuit and transmits the transmitting signal to the second antenna terminal and that causes a received signal in the second band input from the second antenna terminal to pass through the second separator circuit and transmits the received signal to the second receive terminal.

Each of the first transmitter-and-receiver and the second transmitter-and-receiver may also include a matching circuit that performs impedance matching between the antenna and each of a transmit circuit and a receive circuit.

The first separator circuit is defined by, for example, a plurality of SAW (Surface Acoustic Filter) filters, so that a transmitting signal having a center frequency of about 900 MHz, for example, will be output to the first antenna terminal and a received signal having a center frequency of about 940 MHz, for example, input from the first antenna terminal will be output to the first receive terminal. Similarly, the second separator circuit is defined by a plurality of SAW filters so that signals are separated from each other in a band including 1800 MHz.

In a radio-frequency module according to a preferred embodiment of the present invention, the first separator circuit is located on the substrate between the first amplifier circuit and the second separator circuit.

With the arrangement of the circuits, since the first separator circuit is spatially interposed between the first amplifier circuit and the second separator circuit, coupling (electromagnetic coupling and electrostatic coupling) is less likely to occur in a space between a path from the first amplifier circuit to the first separator circuit and a path from the second antenna terminal to the second receive terminal via the second separator circuit. For example, with the above-described arrangement of the circuits, coupling is less likely to occur in a space between an amplifier device of the first amplifier circuit and devices included in the second separator circuit. The above-described space includes, not only a space outside the substrate (for example, a space on the surface of the substrate), but also a space within the substrate.

In a radio-frequency module according to a preferred embodiment of the present invention, coupling is less likely to occur in a space between the path from the first amplifier circuit to the first separator circuit and the path from the second antenna terminal to the second receive terminal via the second separator circuit. As a result, even if harmonic components included in the pass band of the second separator circuit are generated in a transmitting signal (having a center frequency of about 900 MHz, for example) of the first transmitter-and-receiver, a leakage of the second harmonic components into the second receive terminal is effectively reduced or prevented. It is thus possible to improve isolation characteristics of each of the first and second bands.

A radio-frequency module according to a preferred embodiment of the present invention may further include a switch that is disposed on the substrate and that selectively connects one of a plurality of the first separator circuits and the first antenna terminal and selectively connects one of a plurality of the second separator circuits and the second antenna terminal. On the substrate, the first separator circuit may be located between the first amplifier circuit and the switch.

With this configuration, since the first separator circuit is spatially interposed between the first amplifier circuit and the switch, coupling is even less likely to occur in a space between the path from the first amplifier circuit to the first separator circuit and a path from the second antenna terminal to the second separator circuit via the switch.

The first amplifier circuit may be located on the substrate at one end of a diagonal line of the substrate, and the second separator circuit may be located on the substrate at the other end of the diagonal line.

With this configuration, it is possible to increase the distance between the first amplifier circuit and the second separator circuit on the substrate, thus further reducing or preventing the occurrence of the above-described coupling.

The substrate may include first and second main surfaces. The first main surface may include an electrode used to mount the substrate on another substrate. The second main surface may oppose the first main surface. The second receive terminal may be disposed on the first main surface. In a plan view of the substrate, a region where the second separator circuit is disposed may be superposed on a region where the second receive terminal is disposed.

For example, in a plan view of the substrate, a RX terminal of the second separator circuit connected to the second receive terminal and the second receive terminal connected to the receive circuit are arranged such that they oppose each other. With this configuration, the wiring between the RX terminal of the second separator circuit and the second receive terminal becomes shorter and the occurrence of the above-described coupling is further reduced or prevented.

A radio-frequency module according to a preferred embodiment of the present invention may further include a via-conductor that is located between the first amplifier circuit and the second separator circuit on the substrate.

Since the via-conductor is interposed between the first amplifier circuit and the second separator circuit, it is possible to further reduce or prevent the occurrence of the above-described coupling.

The second separator circuit may include a transmitter terminal connected to the second amplifier circuit and a receiver terminal connected to the second receive terminal. The transmitter terminal may be located on the substrate closer to the first amplifier circuit than the receiver terminal.

The transmitter terminal of each of a plurality of the second separator circuits may be located on the substrate closer to the first amplifier circuit than the receiver terminal of a corresponding one of the second separator circuits.

In other words, the receiver terminal connected to the second receive terminal is located farther from the first amplifier circuit. By disposing the terminals of the second separator circuit in this manner, it is possible to further reduce or prevent the occurrence of the above-described coupling.

In radio-frequency modules according to various preferred embodiments of the present invention, even when signals of different bands are wirelessly transmitted and received at the same time, isolation characteristics of each band are effectively improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A radio-frequency module 100 according to a first preferred embodiment will be described below. The radio-frequency module 100 transmits and receives LTE (Long Term Evolution)-standard signals (for example, signals of about 700 MHz to about 2700 MHz). For transmitting and receiving signals, the radio-frequency module 100 amplifies a transmitting signal, separates a transmitting signal and a received signal from each other by frequency division, and switches between communication bands. The radio-frequency module 100 utilizes carrier aggregation, that is, the radio-frequency module 100 wirelessly transmits and receives signals of multiple bands at the same time.

Figure 1:
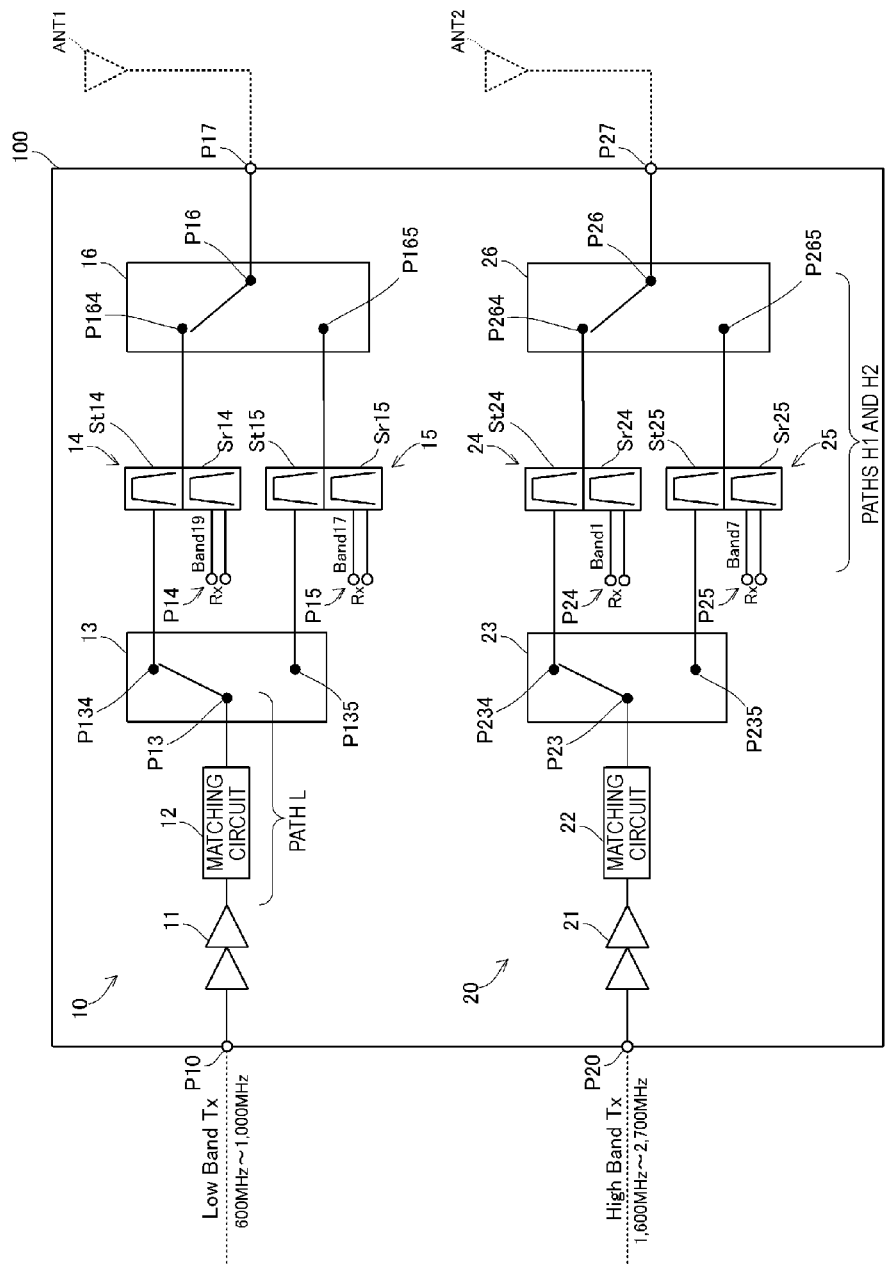
FIG. 1 is a diagram illustrating a circuit of a radio-frequency module according to a first preferred embodiment of the present invention.

Details of the radio-frequency module 100 will now be described with reference to FIG. 1. FIG. 1 is a diagram illustrating a circuit example of the radio-frequency module 100.

As shown in FIG. 1, the radio-frequency module 100 includes a low-band transmitter-and-receiver 10 and a high-band transmitter-and-receiver 20.

The low-band transmitter-and-receiver 10 includes an input terminal P10 and a first antenna terminal P17. A low-band transmitting signal is input into the input terminal P10. The first antenna terminal P17 is connected to a low-band antenna ANT1. The high-band transmitter-and-receiver 20 includes an input terminal P20 and a second antenna terminal P27. A high-band transmitting signal is input into the input terminal P20. The second antenna terminal P27 is connected to a high-band antenna ANT2.

In this preferred embodiment, the band of a signal transmitted and received by the low-band transmitter-and-receiver 10, which is a first band, preferably is, for example, about 600 MHz to about 1000 MHz, while the band of a signal transmitted and received by the high-band transmitter-and-receiver 20, which is a second band, preferably is, for example, about 1600 MHz to 2700 about MHz.

The low-band transmitter-and-receiver 10 includes an amplifier circuit 11, a matching circuit 12, a sub-switch 13, a plurality of duplexers 14 and 15, and a main switch 16.

The amplifier circuit 11 amplifies a low-band (about 600 MHz to about 1000 MHz) transmitting signal input into the input terminal P10 and outputs the amplified transmitting signal to the matching circuit 12. The matching circuit 12 includes, for example, an inductor and a capacitor, and performs impedance matching between the first antenna ANT1 and the amplifier circuit 11.

The sub-switch 13 includes a common terminal P13 and a plurality of individual terminals P134 and P135. The common terminal P13 is connected to the matching circuit 12. The individual terminal P134 is connected to the duplexer 14, while the individual terminal P135 is connected to the duplexer 15.

In order to select one of the duplexers 14 and 15 used in a path between the matching circuit 12 and the first antenna ANT1, in combination with the sub-switch 13, the main switch 16 selectively connects the matching circuit 12 and one of the duplexers and connects the selected duplexer and the first antenna terminal P17. In this case, the selection of the duplexer by the main switch 16 and the sub-switch 13 is performed based on a control signal output from a control IC 221 (see FIG. 2).

The duplexer 14 separates a transmitting signal and a received signal from each other by frequency division in LTE-standard band19 (about 800 MHz band), for example. More specifically, the duplexer 14 includes one common terminal and two individual terminals, and includes a transmit filter St14 and a receive filter Sr14 integrally provided in a single housing. The receive filter Sr14 has a balanced-unbalanced transforming function.

The common terminal of the duplexer 14 is connected to an individual terminal P164 of the main switch 16. The transmit filter St14 and the individual terminal P134 of the sub-switch 13 are connected to one individual terminal of the duplexer 14. The receive filter Sr14 and a receive terminal P14 are connected to the other individual terminal of the duplexer 14. The receive terminal P14 is connected to a receive circuit (not shown) on a main substrate, which is not the substrate on which the radio-frequency module 100 is mounted.

The transmit filter St14 is, for example, a SAW (Surface Acoustic Wave) filter, in which the band of about 830 MHz to about 845 MHz is the pass band and the other bands are the attenuation bands. The receive filter Sr14 is, for example, a SAW filter, in which the band of about 875 MHz to about 890 MHz is the pass band and the other bands are the attenuation bands. Instead of a SAW filter, a BAW (Bulk Acoustic Wave) filter may be used, for example.

The duplexer 15 separates a transmitting signal and a received signal from each other by frequency division, in LTE-standard band17 (about 700 MHz band), for example. More specifically, the duplexer 15 includes one common terminal and two individual terminals, and includes a transmit filter St15 and a receive filter Sr15 integrally provided in a single housing. The receive filter Sr15 has a balanced-unbalanced transforming function.

The common terminal of the duplexer 15 is connected to an individual terminal P165 of the main switch 16. The transmit filter St15 and the individual terminal P135 of the sub-switch 13 are connected to one individual terminal of the duplexer 15. The receive filter Sr15 and a receive terminal P15 are connected to the other individual terminal of the duplexer 15. The receive terminal P15 is connected to a receive circuit (not shown) on the main substrate, which is not the substrate on which the radio-frequency module 100 is mounted.

The transmit filter St15 is, for example, a SAW filter, in which the band of about 704 MHz to about 716 MHz is the pass band and the other bands are the attenuation bands. The receive filter Sr15 is, for example, a SAW filter, in which the band of about 734 MHz to about 746 MHz is the pass band and the other bands are the attenuation bands.

A common terminal P16 of the main switch 16 is connected to the first antenna terminal P17. The first antenna ANT1 is structured to transmit and receive low-band signals.

The configuration of the high-band transmitter-and-receiver 20 is similar to that of the low-band transmitter-and-receiver 10, and the band of signals transmitted and received by the high-band transmitter-and-receiver 20 is different from that of the low-band transmitter-and-receiver 10. The high-band transmitter-and-receiver 20 includes an amplifier circuit 21, a matching circuit 22, a sub-switch 23, a plurality of duplexers 24 and 25, and a main switch 26.

The amplifier circuit 21 amplifies a high-band (about 1600 MHz to about 2700 MHz, for example) transmitting signal input into the input terminal P20 and outputs the amplified transmitting signal to the matching circuit 22. The matching circuit 22 includes, for example, an inductor and a capacitor, and performs impedance matching between the second antenna ANT2 and the amplifier circuit 21.

The sub-switch 23 includes a common terminal P23 and a plurality of individual terminals P234 and P235. The common terminal P23 is connected to the matching circuit 22. The individual terminal P234 is connected to the duplexer 24, while the individual terminal P235 is connected to the duplexer 25.

In order to select one of the duplexers 24 and 25 used in a connection path between the matching circuit 22 and the second antenna ANT2, in combination with the sub-switch 23, the main switch 26 selectively connects the matching circuit 22 and one of the duplexers and connects the selected duplexer and the second antenna terminal P27. In this case, the selection of the duplexer by the main switch 26 and the sub-switch 23 is performed based on a control signal output from the control IC 221.

The duplexer 24 separates a transmitting signal and a received signal from each other by frequency division, in LTE-standard band1 (about 2100 MHz band), for example. More specifically, the duplexer 24 includes one common terminal and two individual terminals, and includes a transmit filter St24 and a receive filter Sr24 integrally provided in a single housing. The receive filter Sr24 has a balanced-unbalanced transforming function.

The common terminal of the duplexer 24 is connected to an individual terminal P264 of the main switch 26. The transmit filter St24 and the individual terminal P234 of the sub-switch 23 are connected to one individual terminal of the duplexer 24. The receive filter Sr24 and a receive terminal P24 are connected to the other individual terminal of the duplexer 24. The receive terminal P24 is connected to a receive circuit (not shown) on the main substrate, which is not the substrate on which the radio-frequency module 100 is mounted.

The transmit filter St24 is, for example, a SAW filter, in which the band of about 1920 MHz to about 1980 MHz is the pass band and the other bands are the attenuation bands. The receive filter Sr24 is, for example, a SAW filter, in which the band of about 2110 MHz to about 2170 MHz is the pass band and the other bands are the attenuation bands.

The duplexer 25 separates a transmitting signal and a received signal from each other by frequency division, in LTE-standard band7 (about 2600 MHz band), for example. More specifically, the duplexer 25 includes one common terminal and two individual terminals, and includes a transmit filter St25 and a receive filter Sr25 integrally provided in a single housing. The receive filter Sr25 has a balanced-unbalanced transforming function.

The common terminal of the duplexer 25 is connected to an individual terminal P265 of the main switch 26. The transmit filter St25 and the individual terminal P235 of the sub-switch 23 are connected to one individual terminal of the duplexer 25. The receive filter Sr25 and a receive terminal P25 are connected to the other individual terminal of the duplexer 25. The receive terminal P25 is connected to a receive circuit (not shown) on the main substrate, which is not the substrate on which the radio-frequency module 100 is mounted.

The transmit filter St25 is, for example, a SAW filter, in which the band of about 2500 MHz to about 2570 MHz is the pass band and the other bands are the attenuation bands. The receive filter Sr25 is, for example, a SAW filter, in which the band of about 2620 MHz to about 2690 MHz is the pass band and the other bands are the attenuation bands.

A common terminal P26 of the main switch 26 is connected to the second antenna terminal P27. The second antenna ANT2 is structured to transmit and receive high-band signals.

The operation of the radio-frequency module 100 will be described below by taking an example in which signals are transmitted and received in LTE-standard band19. When signals are transmitted and received in LTE-standard band19, in order to output a transmitting signal to the first antenna ANT1 via the duplexer 14, the control IC 221 performs control so that the connection of the sub-switch 13 and that of the main switch 16 will be switched. More specifically, the control IC 221 outputs a control signal to connect the common terminal P13 with the individual terminal P134 and to connect the common terminal P16 with the individual terminal P164 to the sub-switch 13 and the main switch 16.

A transmitting signal input into the input terminal P10 is amplified in the amplifier circuit 11, and then sequentially passes through the matching circuit 12, the sub-switch 13, and the transmit filter St14 of the duplexer 14. As a result, the transmitting signal is filtered so that frequency components of about 704 MHz to about 716 MHz will be the main frequency components. Thereafter, the transmitting signal sequentially passes through the main switch 16 and the first antenna terminal P17 and is output to the first antenna ANT1.

Regarding the reception in LTE-standard band19, a signal received by the first antenna ANT1 sequentially passes through the first antenna terminal P17 and the main switch 16 and is input into the duplexer 14. The receive filter Sr14 filters the received signal so that frequency components of about 875 MHz to about 890 MHz will be output to the receive terminal P14.

In order to utilize carrier aggregation, the radio-frequency module 100 also wirelessly transmits and receives signals in a band other than LTE-standard band19, at the same time as transmitting and receiving signals in LTE-standard band19. A description will be provided below, assuming that the band in which signals are transmitted and received at the same time as transmitting and receiving signals in LTE-standard band19 is band1. When signals are transmitted and received in LTE-standard band1, in order to output a transmitting signal to the second antenna ANT2 via the duplexer 24, the control IC 221 performs control so that the connection of the sub-switch 23 and that of the main switch 26 will be switched. More specifically, the control IC 221 outputs a control signal to connect the common terminal P23 with the individual terminal P234 and to connect the common terminal P26 with the individual terminal P264 to the sub-switch 23 and the main switch 26.

A transmitting signal input into the input terminal P20 is amplified in the amplifier circuit 21, and then sequentially passes through the matching circuit 22, the sub-switch 23, and the transmit filter St24 of the duplexer 24. As a result, the transmitting signal is filtered so that frequency components of about 1920 MHz to about 1980 MHz will be the main frequency components. Thereafter, the transmitting signal sequentially passes through the individual terminal P264 and the common terminal P26 of the main switch 26 and the second antenna terminal P27 and is output to the second antenna ANT2.

Regarding the reception in LTE-standard band1, a signal received by the second antenna ANT2 sequentially passes through the second antenna terminal P27 and the main switch 26 and is input into the duplexer 24. The receive filter Sr24 filters the received signal so that frequency components of about 2110 MHz to about 2170 MHz will be output to the receive terminal P24.

As described above, the radio-frequency module 100 wirelessly transmits and receives signals in LTE-standard band19 (low band) and LTE-standard band1 (high band) at the same time. Similarly, the radio-frequency module 100 wirelessly transmits and receives signals in LTE-standard band17 and LTE-standard band7 at the same time. The radio-frequency module 100 may include a transmitter-and-receiver which transmits and receives signals in standards (for example, W-CDMA standards) other than the LTE standards.

Figure 2:
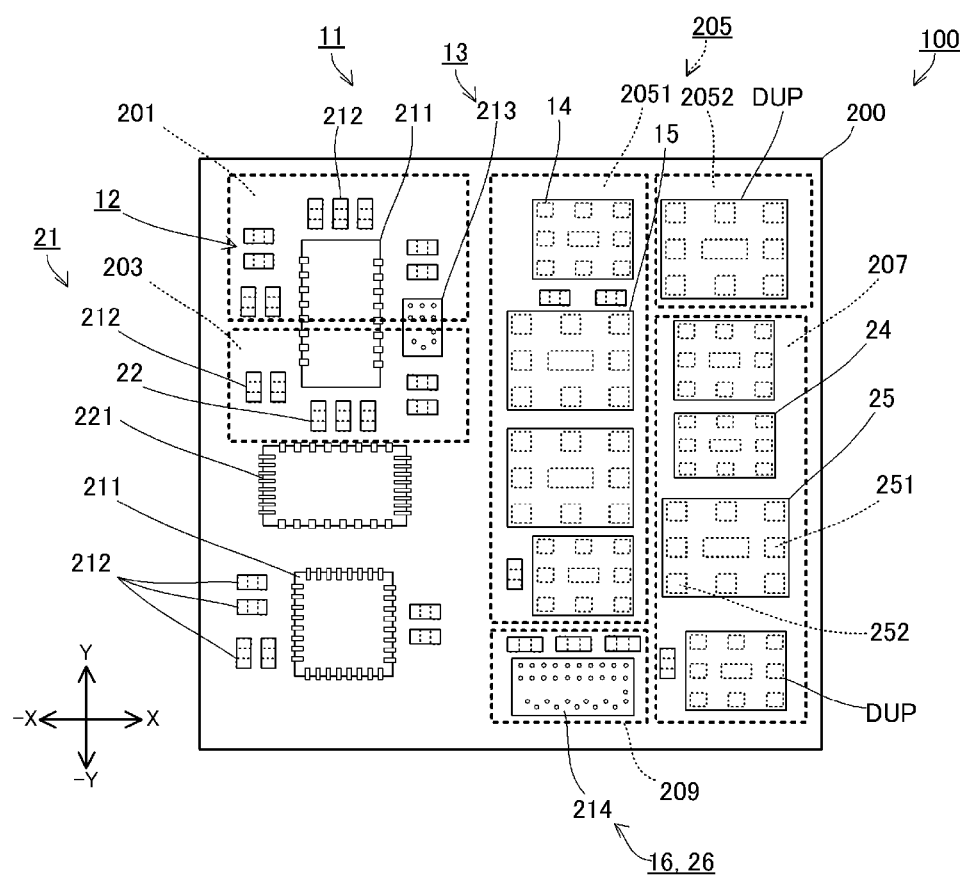
FIG. 2 is a view of the top surface (device mounting surface) of the radio-frequency module according to the first preferred embodiment of the present invention.

The radio-frequency module 100 of this preferred embodiment reduces or prevents leakage of harmonic components of a low-band transmitting signal output from the amplifier circuit into the receive terminals P24 and P25 of the high-band transmitter-and-receiver 20, due to the following distinctive structure. FIG. 2 is a view of the top surface (device mounting surface) of the radio-frequency module 100. The broken lines in FIG. 2 are imaginary lines indicating the regions of a substrate 200.

As shown in FIG. 2, the radio-frequency module 100 is provided by mounting the devices included in the circuit shown in FIG. 1 on the substrate 200. The devices are disposed in the corresponding regions of the substrate 200.

More specifically, the substrate 200 includes regions 201, 203, 205, 207, and 209, as shown in FIG. 2.

In the region 201, the devices included in the amplifier circuit 11, the matching circuit 12, and the sub-switch 13 shown in the circuit example of FIG. 1 are disposed. More specifically, in the region 201, an amplifier device 211, a plurality of chip devices (for example, resistors, capacitors, and inductors) 212, and a switch IC 213 are disposed. The amplifier device 211 and the switch IC 213 are disposed such that they also extend to the region 203.

The amplifier circuit 11 is defined by the amplifier device 211 and the plurality of chip devices 212 in the region 201. The matching circuit 12 is defined by the chip devices 212 in the region 201. The sub-switch 13 is defined by the switch IC 213 in the region 201.

In the region 203, the devices included in the amplifier circuit 21, the matching circuit 22, and the sub-switch 23 shown in the circuit example of FIG. 1 are disposed. The amplifier circuit 21 is defined by the amplifier device 211 and a plurality of chip devices 212 in the region 203. The matching circuit 22 is defined by chip devices 212 in the region 203. The sub-switch 23 is defined by the switch IC 213 in the region 203.

In the region 205, the duplexers 14 and 15 shown in the circuit example of FIG. 1 are disposed. Since the actual radio-frequency module 100 preferably includes three or more low-band duplexers, a duplexer DUP other than the duplexers 14 and 15 is also disposed in the region 205.

In the region 207, the duplexers 24 and 25 shown in the circuit example of FIG. 1 are disposed. Since the actual radio-frequency module 100 includes three or more high-band duplexers, a duplexer DUP other than the duplexers 24 and 25 is also disposed in the region 207.

In the region 209, a switch IC 214 including the main switches 16 and 26 shown in the circuit example of FIG. 1 is disposed.

As shown in FIG. 2, the region 201 is located at a corner of the substrate 200 on the −X side and the +Y side, in a top view of the substrate 200. The region 203 is located on the −Y side of the region 201 on the substrate 200. The region 207 is located at a corner of the substrate 200 on the +X side and the −Y side. That is, in a plan view of the substrate 200, the region 207 is located at one end of a diagonal line of the substrate 200, while the region 201 is located at the other end of the diagonal line. The region 207 has a long dimension in the Y direction and extends to the vicinity of the corner of the substrate 200 on the +X side and the +Y side. The region 209 is located on the −X side of the region 207 on the substrate 200 and along the edge on the −Y side of the substrate 200. The length of the region 209 in the Y direction is shorter than that of the region 207.

On the substrate 200, the region 205 is located between the regions 201 and 207. This will be discussed in more detail below. As shown in FIG. 2, the region 205 includes regions 2051 and 2052. The region 2051 extends from the boundary with the region 209 on the +Y side to the edge of the substrate 200 on the +Y side. The region 2052 is located at a corner of the substrate 200 on the +X side and +Y side. That is, on the substrate 200, the region 2051 is located between the region 207 and the region 201. With this configuration, on the substrate 200, the duplexers (including the duplexers 14 and 15) disposed in the region 2051 are located between the duplexers 24 and 25 disposed in the region 207 and the amplifier device 211 and the switch IC 213 disposed in the region 201. In this arrangement, the low-band duplexers disposed in the region 2051 are spatially interposed between a path L from the amplifier circuit 11 to the sub-switch 13 and a path H1 from the common terminal P26 of the main switch 26 to the receive terminal P24 via the duplexer 24. With the low-band duplexers being spatially interposed between the path L and the path H1, not only the low-band duplexers are spatially interposed between the path L and the path H1 outside the substrate 200 (for example, a space over the top surface of the substrate 200 in the Y direction), but also a path including the low-band duplexers is interposed between the path L and the path H1 within the substrate 200.

In this manner, since the low-band duplexers are spatially interposed between the path L and the path H1, when radio-frequency signals are transmitted and received in LTE-standard band19 and band1, electromagnetic coupling and electrostatic coupling (hereinafter simply referred to as "coupling") is less likely to occur in a space between the path L and the path H1. That is, coupling is less likely to occur between the devices included in the path L and the path H1 and between the transmission lines included in the path L and the path H1. For example, coupling is less likely to occur in a space between the amplifier device 211 included in the path L and the duplexer 24 included in the path H1.

As a result, even if harmonic components of a transmitting signal in LTE-standard band19 (about 830 MHz to about 845 MHz signal) are output from the amplifier circuit 11 and even if such harmonic components include frequency components of the pass band (about 2110 MHz to about 2170 MHz) of the receive filter Sr24 of the duplexer 24, a leakage of the harmonic components into the receive terminal P24 in the radio-frequency module 100 of this preferred embodiment, which would be caused by the coupling between the path L and the path H1, is effectively reduced or prevented. It is thus possible to improve isolation characteristics of LTE-standard band1 and those of band19.

Similarly, since the low-band duplexers are spatially interposed between the path L and a path H2 from the common terminal P16 to the receive terminal P25 via the duplexer 25, when signals are transmitted and received in LTE-standard band17 and band7 at the same time, coupling is less likely to occur in a space between the path L and the path H2.

In the radio-frequency module 100, the region 2052 is located in the +Y side of the region 207. Accordingly, the occurrence of coupling between the path L and each of the paths H1 and H2 which may occur in a space on the +Y side of the region 207 is effectively reduced or prevented.

On the substrate 200, the region 2051 of the region 205 is located near the region 201, as viewed from the region 209. That is, the duplexers 14 and 15 disposed in the region 2051 are located near the amplifier device 211 disposed in the region 201, as viewed from the switch IC 214 disposed in the region 209.

With this configuration, coupling is less likely to occur in a space between the path L from the amplifier circuit 11 to the sub-switch 13 and a path H3 from the second antenna terminal P27 to the duplexer 24 via the main switch 26. Similarly, coupling is less likely to occur in a space between the path L and a path H4 from the second antenna terminal P27 to the duplexer 25 via the main switch 26. It is thus possible to improve isolation characteristics of each band of the LTE standards in the radio-frequency module 100.

Moreover, in the radio-frequency module 100 of this preferred embodiment, by adjusting the arrangement of the duplexer 25 in the following manner, isolation characteristics of each band of the LTE standards are able to be further improved.

As shown in FIG. 2, the duplexer 25 includes a RX terminal 251 and a TX terminal 252. The RX terminal 251 is connected to the receive terminal P25. The TX terminal 252 is connected to the amplifier circuit 21 via the sub-switch 23 and the matching circuit 22 in this order. The RX terminal 251 is located on the X side in the duplexer 25, while the TX terminal 252 is located on the −X side in the duplexer 25. That is, the RX terminal 251 is located such that it is separated farther from the amplifier circuit 11 disposed in the region 201. With this arrangement, since the RX terminal 251 of the duplexer 25 is separated farther from the amplifier circuit 11 disposed in the region 201, coupling is less likely to occur in a space between the path L and a path from the duplexer 25 to the receive terminal P25.

Similarly, not only the duplexer 25, but all of the other duplexers provided in the region 207 may be disposed so that the RX terminals are separated farther from the region 201.

Figure 3:
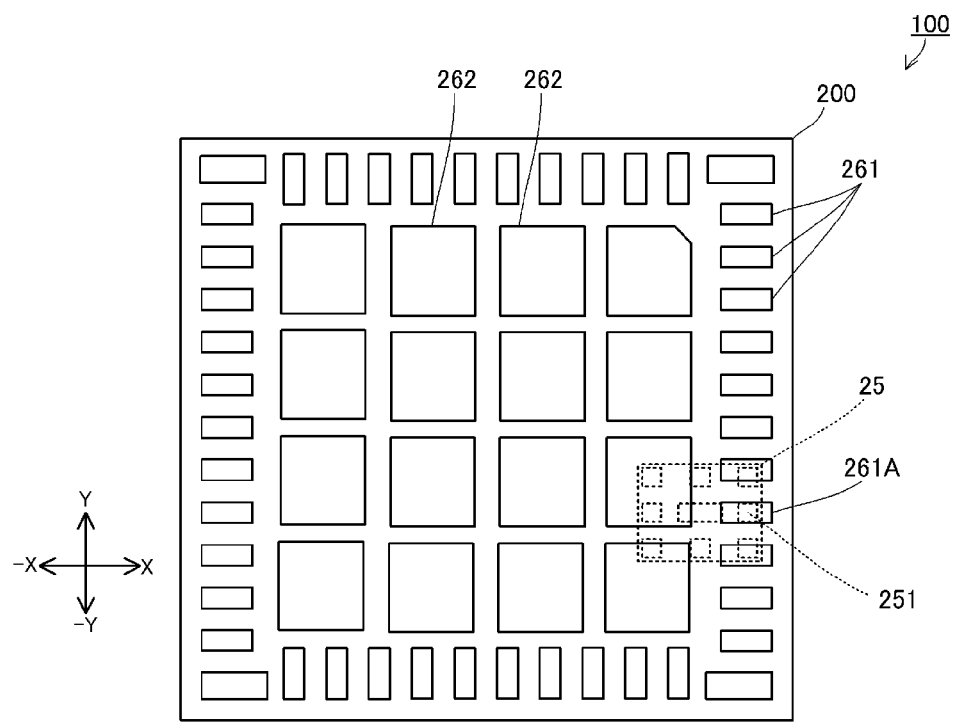
FIG. 3 is a view of the bottom surface (substrate mounting surface) of the radio-frequency module according to the first preferred embodiment of the present invention.

As shown in the view of the bottom surface (substrate mounting surface) of the substrate 200 in FIG. 3, the substrate 200 includes a plurality of ground electrodes 262 and a plurality of electrodes 261 used to mount the substrate 200 on the main substrate (not shown). In a plan view of the substrate 200, the region of an electrode 261A is superposed on the region of the RX terminal 251 of the duplexer 25. The electrode 261A defines the receive terminal P25 and is connected to the receive circuit on the main substrate. If the RX terminal 251 and the electrode 261A are located such that they are superposed on each other, the path between the RX terminal 251 and the receive terminal P25 becomes shorter. In FIG. 3, the duplexer 25 disposed on the top surface of the substrate 200 is indicated by the broken lines.

Since the path between the RX terminal 251 and the receive terminal P25 becomes shorter, coupling is less likely to occur in a space between the path L and the path from the RX terminal 251 to the receive terminal P25. In a plan view of the substrate 200, the region of the RX terminal 251 and the region of the electrode 261A may not necessarily be located such that they are superposed on each other. If the region of the duplexer 25 and the region of the electrode 261A are located such that they are superposed on each other in a plan view of the substrate 200, the path between the RX terminal 251 and the receive terminal P25 also becomes shorter.

Similarly, in a plan view of the substrate 200, the other duplexers within the region 207 may also be located such that the region of the RX terminal of each duplexer and the region of the corresponding electrode 261 on the bottom surface of the substrate 200 are superposed on each other.

In this preferred embodiment, the radio-frequency module 100 which transmits and receives signals in two bands, that is, a low band and a high band, at the same time has been described. In this preferred embodiment, however, a radio-frequency module which transmits and receives signals in three or more different bands at the same time may be utilized. For example, low-band duplexers may be interposed between a low-band amplifier circuit and intermediate-band duplexers on the substrate 200. In this case, even if harmonic components of a low-band (about 600 MHz to about 1000 MHz, for example) transmitting signal include intermediate-band (about 1400 MHz to about 1600 MHz, for example) frequency components, it is still possible to improve isolation characteristics of each band.

Figure 4A:
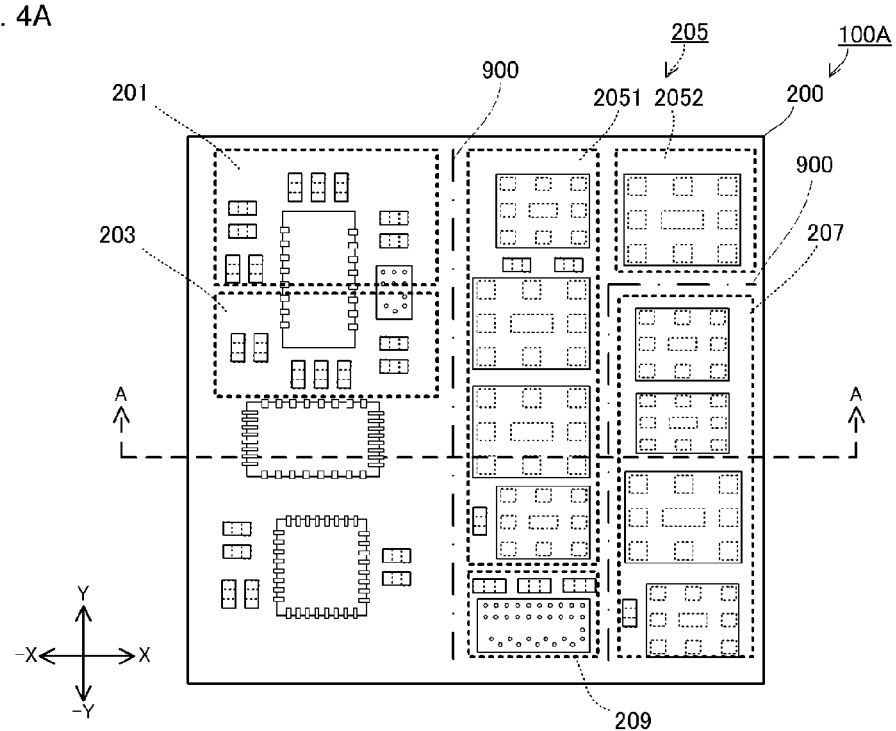
FIG. 4A is a view of the top surface (device mounting surface) of a radio-frequency module, which is a modified example of the radio-frequency module according to the first preferred embodiment of the present invention.
Figure 4B:
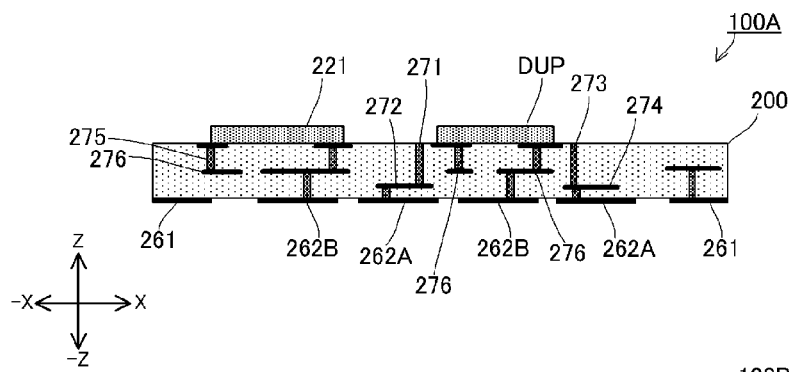
FIG. 4B is a sectional view taken along line A-A of FIG. 4A.

A radio-frequency module 100A, which is a first modified example of the radio-frequency module 100, will now be described below with reference to FIGS. 4A and 4B. FIG. 4A is a top view of the radio-frequency module 100A. FIG. 4B is a sectional view taken along line A-A of FIG. 4A. In FIG. 4A, the long dashed dotted lines are imaginary lines indicating the positions at which via-conductors are disposed.

The radio-frequency module 100A is different from the radio-frequency module 100 shown in FIGS. 2 and 3 in that via-conductors are disposed in the substrate 200, which is a multilayer substrate, so as to separate the region 205 from other regions. An explanation of the other portions of the radio-frequency module 100A similar to those of the radio-frequency module 100 will be omitted.

More specifically, as shown in FIG. 4A, an imaginary line 900 is set so as to separate the region including the region 2051 and the region 209 from the region 201. An imaginary line 901 is set so as to separate the region 207 from the region including the regions 205 and 209.

As shown in the sectional view of FIG. 4B taken along line A-A of FIG. 4A, a plurality of via-conductors and a plurality of inner wirings are disposed within the substrate 200.

More specifically, as shown in FIG. 4B, a via-conductor 271 extends within the substrate 200 in the Z direction. The via-conductor 271 is one of the via-conductors disposed along the imaginary line 900. The via-conductor 271 is connected to a ground electrode 262A on the bottom surface of the substrate 200 via an inner wiring 272 and another via-conductor.

Similarly, as shown in FIG. 4B, a via-conductor 273 extends within the substrate 200 in the Z direction. The via-conductor 273 is one of the via-conductors disposed along the imaginary line 901. The via-conductor 273 is connected to a ground electrode 262A on the bottom surface of the substrate 200 via an inner wiring 274 and another via-conductor.

The via-conductors 271 and 273 are used to reduce or prevent coupling which may occur between the devices and between the transmission lines. The via-conductors 271 and 273 are electrically isolated from the low-band transmitter-and-receiver 10 and the high-band transmitter-and-receiver 20. Accordingly, the via-conductors 271 and 273 do not influence the transmission and reception of signals performed by the radio-frequency module 100A. Similarly, the inner wirings 272 and 274 to respectively connect the via-conductors 271 and 273 to the ground electrodes 262A are also electrically isolated from the low-band transmitter-and-receiver 10 and the high-band transmitter-and-receiver 20, and do not influence the transmission and reception of signals performed by the radio-frequency module 100A.

The control IC 221 and the duplexers DUP are mounted on the substrate 200 by connecting terminals on corresponding mounting electrodes on the top surface of the substrate 200. As shown in FIG. 4B, the mounting electrodes are each connected to a corresponding one of ground electrodes 262B and electrodes 261 by a via-conductor 275 and an inner wiring 276. The ground electrodes 262B are not connected to the ground electrodes 262A on the substrate 200. That is, in the substrate 200, ground patterns of devices which are necessary to transmit and receive signals, such as the duplexers DUP, are not connected, via the ground electrodes 262A and 262B, to ground patterns of the via-conductors 271 and 273 which do not influence the transmission and reception of signals.

In the radio-frequency module 100A, a plurality of via-conductors 271 and 273 are interposed between the region 201 in which the amplifier circuit 11 is disposed and the region 207 in which the duplexers 24 and 25 are disposed. It is thus possible to further reduce or prevent the occurrence of coupling in a space between the path L from the amplifier circuit 11 to the sub-switch 13 and the paths H1 and H2 from the main switch 26 to the receive terminals P24 and P25 via the duplexers 24 and 25, respectively.

In the substrate 200, the ground patterns of devices which are necessary to transmit and receive signals, such as the duplexers DUP, are not connected to the ground patterns of the via-conductors 271 and 273 which do not influence the transmission and reception of signals. Accordingly, harmonic components of a transmitting signal output from the amplifier circuit 11 are less likely to leak into the receive terminals P24 and P25 via the ground patterns including the via-conductors 271 and 273.

The via-conductors 271 and 273 may be directly connected to the ground electrodes 262A without including the inner wirings 272 and 274 interposed therebetween. This makes it possible to even further reduce or prevent the occurrence of the above-described coupling.

In the radio-frequency module 100A, a plurality of via-conductors may be disposed along only one of the imaginary lines 900 and 901.

In the radio-frequency module 100A, by providing the plurality of via-conductors 271 and 273, the occurrence of the above-described coupling is reduced or prevented. However, the occurrence of the above-described coupling may be reduced or prevented by using a configuration other than that of the via-conductors.

Figure 4C:
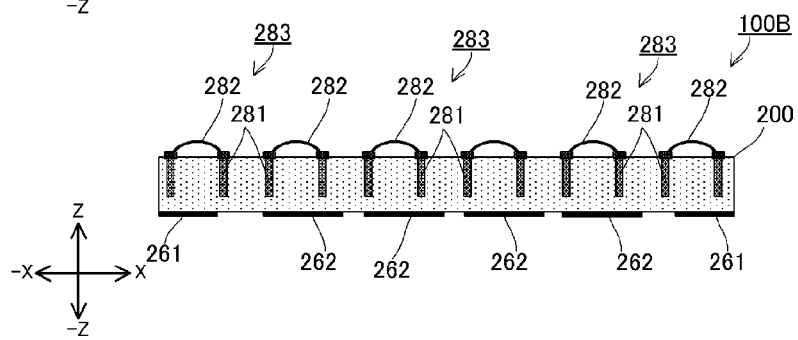
FIG. 4C is a sectional view of a radio-frequency module, which is another modified example of the radio-frequency module according to the first preferred embodiment of the present invention.

For example, as shown in a sectional view of FIG. 4C, in a radio-frequency module 100B, a plurality of via-conductors 281 extending in the Z direction within the substrate 200 and bonding wires 282, each of which connects corresponding two via-conductors 281 adjacent to each other in the X direction, are provided. With this configuration, a plurality of conductors 283 having an inverted angular U shape with the bottom side near the bottom surface of the substrate 200 opened are provided.

In this manner, by configuring the plurality of conductors 283 in an inverted angular U shape in the substrate 200, it is possible to provide a plurality of inductors having an axis in a direction perpendicular or substantially perpendicular to a direction parallel or substantially parallel with the planar direction of the substrate 200 and perpendicular or substantially perpendicular to the direction in which the a plurality of conductors 283 are disposed (that is, the x-axis direction in FIG. 4C). With this configuration, the coupling between paths in the axis direction of the inductors is even less likely to occur.

Figure 5:
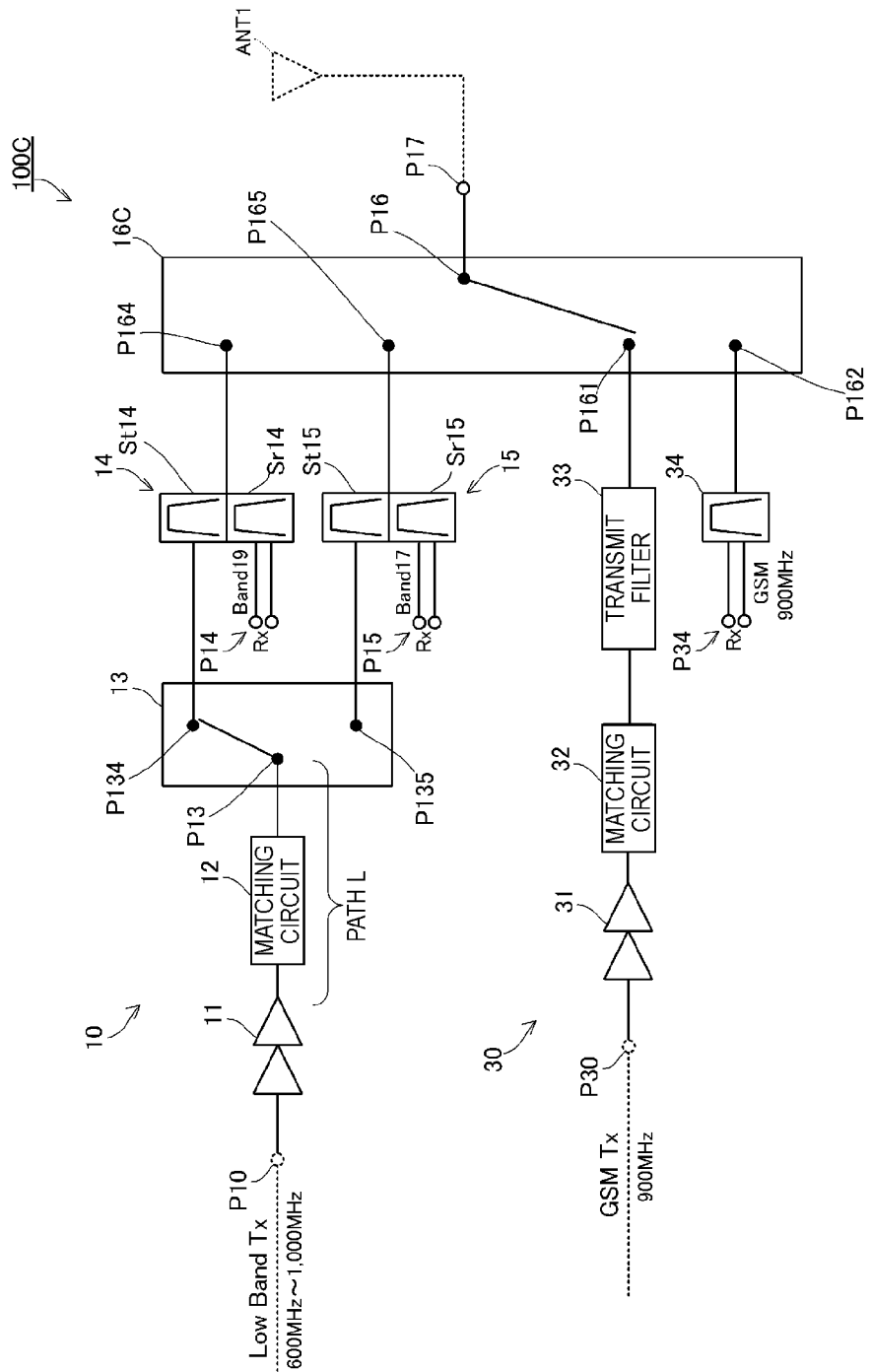
FIG. 5 is a diagram of a low-band circuit of a radio-frequency module according to a second preferred embodiment of the present invention.
Figure 6:
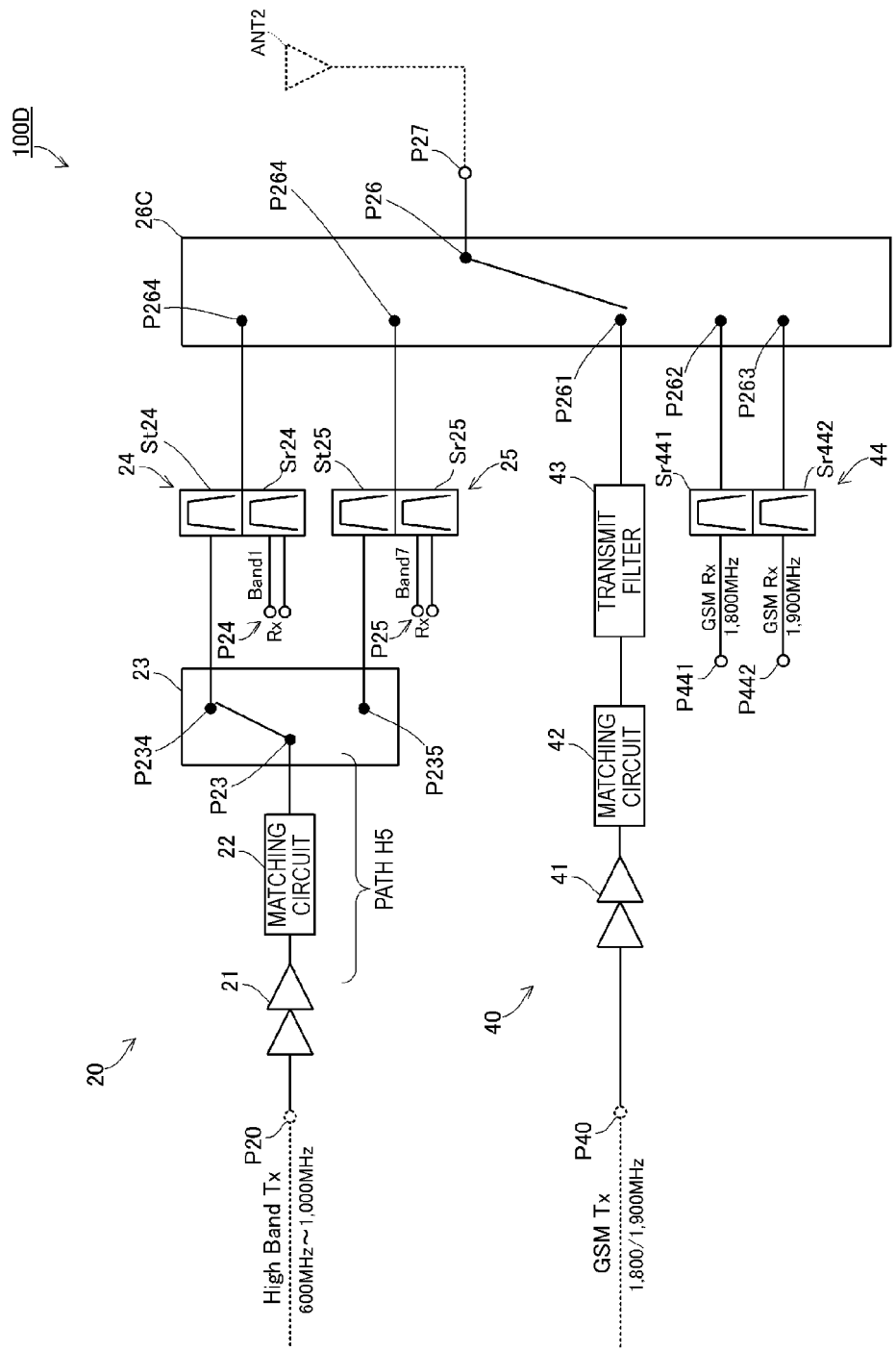
FIG. 6 is a diagram of a high-band circuit of the radio-frequency module according to the second preferred embodiment of the present invention.
Figure 7:
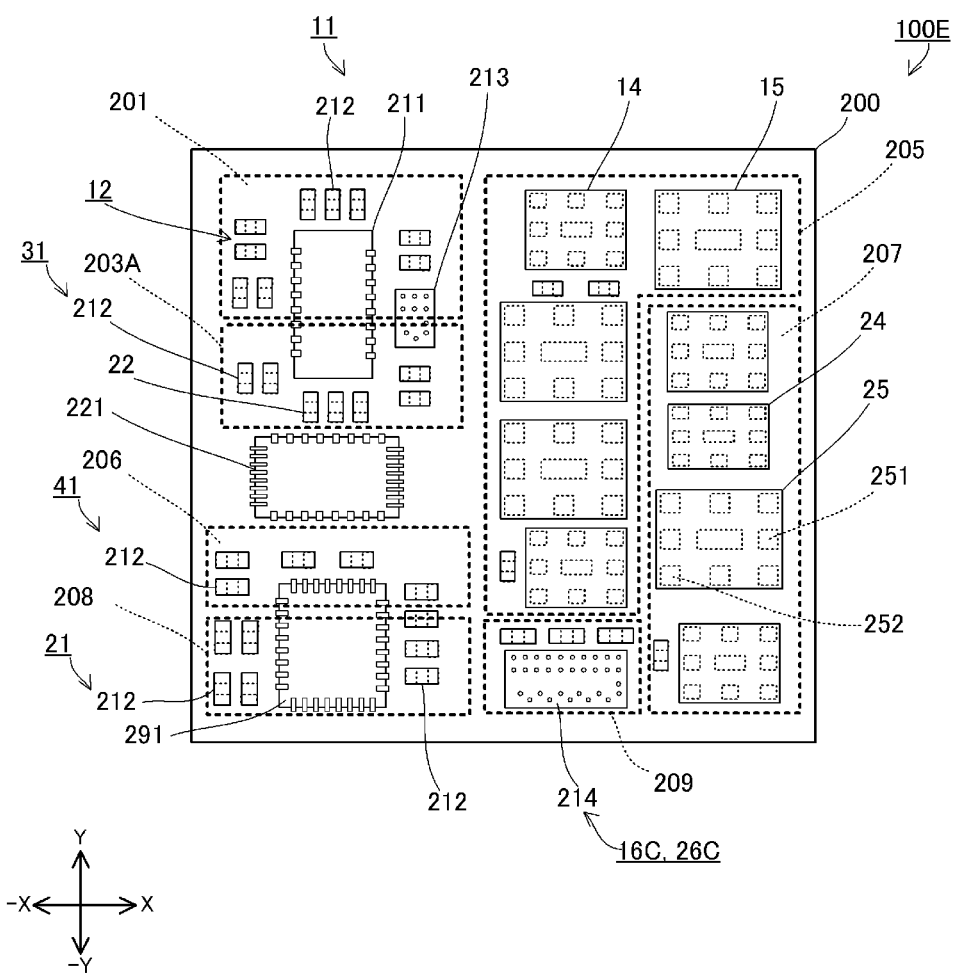
FIG. 7 is a view of the top surface (device mounting surface) of the radio-frequency module according to the second preferred embodiment of the present invention.

Radio-frequency modules 100C, 100D, and 100E according to a second preferred embodiment will now be described below with reference to FIGS. 5 through 7. FIG. 5 is a diagram of a circuit of the radio-frequency module 100C. FIG. 6 is a diagram of a circuit of the radio-frequency module 100D. FIG. 7 is a view of the top surface (device mounting surface) of a substrate 200 on which the radio-frequency modules 100C and 100D are mounted. The circuit example shown in FIG. 5 is a circuit which transmits and receives low-band signals, while the circuit example shown in FIG. 6 is a circuit which transmits and receives high-band signals.

The radio-frequency module 100C is different from the radio-frequency module 100 in that it includes a low-band transmitter-and-receiver 30 which transmits and receives signals in the GSM (Global System for Mobile Communications, registered trademark) standards and a low-band transmitter-and-receiver 410. The radio-frequency module 100D is different from the radio-frequency module 100 in that it includes a high-band transmitter-and-receiver 20, and a high-band transmitter-and-receiver 40 which transmits and receive signals in the GSM (registered trademark) standards. In the radio-frequency module 100E, on the substrate 200, the circuit of the GSM-standard low-band transmitter-and-receiver 30 is located between the amplifier circuit 11 of the LTE-standard low-band transmitter-and-receiver 10 and the amplifier circuit 21 of the LTE-standard high-band transmitter-and-receiver 20, thus reducing or preventing a leakage of harmonic components of a transmitting signal output from the amplifier circuit 11 into the amplifier circuit 21. An explanation of the other portions of the radio-frequency modules 100C, 100D, and 100E similar to those of the radio-frequency module 100 will be omitted.

The radio-frequency module 100E is a mounting body on which the radio-frequency modules 100C and 100D are mounted, and includes the LTE-standard low-band transmitter-and-receiver 10, the LTE-standard high-band transmitter-and-receiver 20, the GSM-standard low-band transmitter-and-receiver 30, and the GSM-standard high-band transmitter-and-receiver 40.

The low-band transmitter-and-receiver 30 transmits and receives signals in the GSM900 standards (about 900 MHz band). More specifically, as shown in FIG. 5, the low-band transmitter-and-receiver 30 includes an input terminal P30, an amplifier circuit 31, a matching circuit 32, a transmit filter 33, and a SAW filter 34.

The amplifier circuit 31 amplifies a signal input into the input terminal P30. The signal amplified by the amplifier circuit 31 is input into the transmit filter 33 via the matching circuit 32. The transmit filter 33 is a filter in which the band of GSM900-standard transmitting signals is the pass band and the other bands are the attenuation bands. The output terminal of the transmit filter 33 is connected to an individual terminal P161 of a main switch 16C.

The SAW filter 34 includes a balanced-unbalanced transforming function. One end of the SAW filter 34 is connected to an individual terminal P162 of the main switch 16C, and the other end thereof, which is a balanced terminal, is connected to a receive terminal P34. The receive terminal P34 is connected to a receive circuit (not shown) on a main substrate, which is not the substrate on which the radio-frequency module 100C is mounted.

The high-band transmitter-and-receiver 40 transmits and receives signals in the GSM1800 standards (about 1800 MHz band) or GSM1900 standards (about 1900 MHz band). More specifically, as shown in FIG. 6, the high-band transmitter-and-receiver 40 includes an input terminal P40, an amplifier circuit 41, a matching circuit 42, a transmit filter 43, and a diplexer 44.

The amplifier circuit 41 amplifies a signal input into the input terminal P40. The signal amplified by the amplifier circuit 41 is input into the transmit filter 43 via the matching circuit 42. The transmit filter 43 is a filter in which the bands of GSM1800-standard and GSM1900-standard transmitting signals are the pass bands and the other bands are the attenuation bands. The output terminal of the transmit filter 43 is connected to an individual terminal P261 of a main switch 26C.

The diplexer 44 includes SAW filters Sr441 and Sr442. The SAW filter Sr441 is a filter in which the band of GSM1800-standard received signals is the pass band and the other bands are the attenuation bands. One end of the SAW filter Sr441 is connected to an individual terminal P262 of the main switch 26C, and the other end thereof is connected to a receive terminal P441. The receive terminal P441 is connected to a receive circuit (not shown) on the main substrate, which is not the substrate on which the radio-frequency module 100D is mounted. The SAW filter Sr442 is a filter in which the band of GSM1900-standard received signals is the pass band and the other bands are the attenuation bands. One end of the SAW filter Sr442 is connected to an individual terminal P263 of the main switch 26C, and the other end thereof is connected to a receive terminal P442. The receive terminal P442 is connected to a receive circuit (not shown) on the main substrate, which is not the substrate on which the radio-frequency module 100E is mounted.

As shown in FIG. 7, the substrate 200 of the radio-frequency module 100E includes regions 201, 203A, 205, 207, 209, 206, and 208.

The region 203A is different from the region 203 in that devices included in the GSM-standard low-band amplifier circuit 31 shown in the circuit of FIG. 5 are disposed. More specifically, the amplifier circuit 31 is defined by an amplifier circuit 211 which also extends to the region 201 and a plurality of chip devices 212.

The region 208 is located at a corner of the substrate 200 on the −X side and −Y side. The region 206 is located on the +Y side of the region 208 on the substrate 200.

In the region 206, devices included in the GSM (registered trademark)-standard high-band amplifier circuit 41 shown in the circuit of FIG. 6 are disposed. More specifically, in the region 206, an amplifier device 291 and a plurality of chip devices 212 are disposed. The amplifier device 291 also extends to the region 208. The amplifier circuit 41 is defined by the amplifier device 291 and a plurality of chip devices 212 in the region 206.

In the region 208, devices included in the LTE-standard high-band amplifier circuit 21 are disposed. More specifically, in the region 208, the amplifier circuit 291 which also extends to the region 206 and a plurality of chip devices 212 are disposed.

The GSM (registered trademark)-standard amplifier circuits 31 and 41 are interposed between the LTE-standard low-band amplifier circuit 11 and the LTE-standard high-band amplifier circuit 21. With this configuration, coupling is less likely to occur between the path L from the amplifier circuit 11 to the common terminal P13 of the sub-switch 13 and a path H5 from the amplifier circuit 21 to the common terminal P23 of the sub-switch 23. Accordingly, harmonic components of a transmitting signal output from the amplifier circuit 11 is less likely to leak into the receive terminals P24 and P25 via the coupling between the path L and the path H5, the sub-switch 23, and the duplexers 24 and 25 in this order. Even if the GSM (registered trademark)-standard amplifier circuit 31 is merely interposed between the LTE-standard amplifier circuits 11 and 21, it is possible to reduce or prevent the occurrence of coupling between the path L and the path H5.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio-frequency module comprising:
a first transmitter-and-receiver that transmits a first transmitting signal and receives a first received signal in a first band; and
a second transmitter-and-receiver that transmits a second transmitting signal and receives a second received signal in a second band higher than the first band; wherein
the first transmitter-and-receiver and the second transmitter-and-receiver are mounted on a substrate;
the first transmitter-and-receiver includes:
a first antenna terminal connected to a first antenna;
a first receive terminal connected to a first receive circuit;
a first amplifier circuit that amplifies the first transmitting signal; and
a first separator circuit that causes the first transmitting signal in the first band amplified by the first amplifier circuit to pass through the first separator circuit and transmits the first transmitting signal to the first antenna terminal and that causes the first received signal in the first band input from the first antenna terminal to pass through the first separator circuit and transmits the first received signal to the first receive terminal;
the second transmitter-and-receiver includes:
a second antenna terminal connected to a second antenna;
a second receive terminal connected to a second receive circuit;
a second amplifier circuit that amplifies the second transmitting signal; and
a second separator circuit that causes the second transmitting signal in the second band amplified by the second amplifier circuit to pass through the second separator circuit and transmits the second transmitting signal to the second antenna terminal and that causes the second received signal in the second band input from the second antenna terminal to pass through the second separator circuit and transmits the second received signal to the second receive terminal; and
the first separator circuit is located on the substrate between the first amplifier circuit and the second separator circuit.

2. The radio-frequency module according to claim 1, further comprising:
a switch that is disposed on the substrate and that selectively connects one of a plurality of the first separator circuits and the first antenna terminal and selectively connects one of a plurality of the second separator circuits and the second antenna terminal; wherein
the first separator circuit is located on the substrate between the first amplifier circuit and the switch.

3. The radio-frequency module according to claim 2, wherein
the first transmitter-and-receiver further includes a first matching circuit and a first sub-switch;
the first matching circuit is disposed between the first amplifier circuit and the first sub-switch; and
the first sub-switch is disposed between the plurality of the first separator circuits and the first matching circuit.

4. The radio-frequency module according to claim 3, wherein the first matching circuit includes an inductor and a capacitor and performs impedance matching between the first amplifier circuit and the first antenna.

5. The radio-frequency module according to claim 3, wherein the first sub-switch includes a common terminal connected to the first matching circuit and a plurality of individual terminals respectively connected to the plurality of the first separator circuits.

6. The radio-frequency module according to claim 2, wherein
the second transmitter-and-receiver further includes a second matching circuit and a second sub-switch;

the second matching circuit is disposed between the second amplifier circuit and the second sub-switch; and the second sub-switch is disposed between the plurality of the second separator circuits and the second matching circuit.

7. The radio-frequency module according to claim 6, wherein the second matching circuit includes an inductor and a capacitor and performs impedance matching between the second amplifier circuit and the second antenna.

8. The radio-frequency module according to claim 6, wherein the second sub-switch includes a common terminal connected to the second matching circuit and a plurality of individual terminals respectively connected to the plurality of the second separator circuits.

9. The radio-frequency module according to claim 1, wherein the first amplifier circuit is located on the substrate at one end of a diagonal line of the substrate; and the second separator circuit is located on the substrate at the other end of the diagonal line.

10. The radio-frequency module according to claim 1, wherein the substrate includes first and second main surfaces, the first main surface including an electrode to mount the substrate on another substrate, and the second main surface opposing the first main surface;

the second receive terminal is disposed on the first main surface; and in a plan view of the substrate, a region where the second separator circuit is disposed is superposed on a region where the second receive terminal is disposed.

11. The radio-frequency module according to claim 1, further comprising a via-conductor between the first amplifier circuit and the second separator circuit on the substrate.

12. The radio-frequency module according to claim 1, wherein the second separator circuit includes a transmitter terminal connected to the second amplifier circuit and a receiver terminal connected to the second receive terminal; and the transmitter terminal is located on the substrate closer to the first amplifier circuit than the receiver terminal.

13. The radio-frequency module according to claim 12, wherein the transmitter terminal of each of a plurality of the second separator circuits is located on the substrate closer to the first amplifier circuit than the receiver terminal of a corresponding one of the second separator circuits.

14. The radio-frequency module according to claim 1, wherein the first separator circuit is defined by a duplexer that includes one common terminal, two individual terminals, and a transmit filter and a receive filter that are integrally provided in a single housing.

15. The radio-frequency module according to claim 14, wherein the receive filter has a balanced-unbalanced transforming function.

16. The radio-frequency module according to claim 14, wherein each of the transmit filter and the receive filter are SAW filters.

17. The radio-frequency module according to claim 1, wherein the second separator circuit is defined by a duplexer that includes one common terminal, two individual terminals, and a transmit filter and a receive filter integrally provided in a single housing.

18. The radio-frequency module according to claim 17, wherein the receive filter has a balanced-unbalanced transforming function.

19. The radio-frequency module according to claim 17, wherein each of the transmit filter and the receive filter are SAW filters.

* * * * *